US012575352B2

(12) United States Patent
Okabe et al.

(10) Patent No.: US 12,575,352 B2
(45) Date of Patent: Mar. 10, 2026

(54) ETCHING METHOD AND ETCHING APPARATUS

(71) Applicant: Tokyo Electron Limited, Tokyo (JP)

(72) Inventors: Noriaki Okabe, Tokyo (JP); Naoki Shindo, Yamanashi (JP); Gen You, Yamanashi (JP); Takuya Seino, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 321 days.

(21) Appl. No.: 18/098,112

(22) Filed: Jan. 18, 2023

(65) Prior Publication Data

US 2023/0178378 A1     Jun. 8, 2023

Related U.S. Application Data

(63) Continuation of application No. PCT/JP2021/025391, filed on Jul. 6, 2021.

(30) Foreign Application Priority Data

Jul. 20, 2020    (JP) ................................. 2020-123868

(51) Int. Cl.
    *H10P 50/28*      (2026.01)
    *H10P 50/00*      (2026.01)
    *H10P 72/00*      (2026.01)
(52) U.S. Cl.
    CPC ............ *H10P 50/283* (2026.01); *H10P 50/73* (2026.01); *H10P 72/0421* (2026.01)
(58) Field of Classification Search
    None
    See application file for complete search history.

(56) References Cited

U.S. PATENT DOCUMENTS

2004/0198065 A1* 10/2004 Lee ..................... H01L 21/3081
                                             257/E21.232
2018/0337047 A1* 11/2018 Fung ................... H01L 21/0337

FOREIGN PATENT DOCUMENTS

| JP | 2003-133293 A | 5/2003 |
| JP | 2006-24730 A | 1/2006 |
| JP | 2014-236055 A | 12/2014 |
| JP | 2018-120924 A | 8/2018 |

OTHER PUBLICATIONS

International Search Report and Written Opinion mailed on Sep. 21, 2021, received for PCT Application PCT/JP2021/025391, filed on Jul. 6, 2021, 9 pages including English Translation.

* cited by examiner

*Primary Examiner* — Roberts P Culbert
(74) *Attorney, Agent, or Firm* — XSENSUS LLP

(57) ABSTRACT

An etching method includes a preparing step and a removing step. In the preparing step, a substrate is prepared which includes a first film, a second film stacked on the first film, and a hard mask stacked on the second film, such that the second film is etched with the hard mask having a formed pattern as a mask until the first film is exposed. In the removing step, the hard mask is removed using a fluorine-containing gas. Further, the removing step is executed for a time longer than a first time from a start of a supply of the fluorine-containing gas to a start of an etching of the hard mask, and shorter than a second time from the start of the supply of the fluorine-containing gas to a start of an etching of the first film.

15 Claims, 6 Drawing Sheets

ETCHING METHOD AND ETCHING APPARATUS

CROSS-REFERENCE TO RELATED APPLICATIONS

This application is a bypass continuation application of international application No. PCT/JP2021/025391 having an international filing date of Jul. 6, 2021 and designating the United States, the international application being based upon and claiming the benefit of priority from Japanese Patent Application No. 2020-123868, filed on Jul. 20, 2020, the entire contents of both of which are incorporated herein by reference.

TECHNICAL FIELD

Various aspects and embodiments of the present disclosure relate to an etching method and an etching apparatus.

BACKGROUND

For example, Patent Document 1 discloses a technology of etching a silicon-containing film using a tungsten-containing silicon hard mask. Further, Patent Document 2 described below discloses a technology of forming a hole in which a lower layer film is exposed using a hard mask as a mask, then embedding a sacrificial film into the hole, and removing the sacrificial film after the hard mask is removed, so as to suppress damage to the lower layer film.

PRIOR ART DOCUMENTS

Patent Documents

Patent Document 1: WO2018/084186
Patent Document 2: US2015/0279733 Specification

SUMMARY

Technical Problems

The present disclosure provides an etching method and an etching apparatus capable of, among other things, reducing an amount of work included in a step of removing a hard mask.

Solutions to Problem

An aspect of the present disclosure is an etching method that includes a preparing step and a removing step. In the preparing step, a substrate is prepared which includes a first film, a second film stacked on the first film, and a hard mask stacked on the second film, such that the second film is etched with the hard mask having a formed pattern as a mask until the first film is exposed. In the removing step, the hard mask is removed using a fluorine-containing gas. Further, the removing step is executed for a time longer than a first time from a start of a supply of the fluorine-containing gas to a start of an etching of the hard mask, and shorter than a second time from the start of the supply of the fluorine-containing gas to a start of an etching of the first film.

Advantageous Effect of the Disclosure

According to various aspects and embodiments of the present disclosure, it is possible to reduce an amount of work included in the step of removing the hard mask.

DETAILED DESCRIPTION

Hereinafter, embodiments of an etching method and an etching apparatus disclosed herein will be described in detail with reference to the drawings. The etching method and the etching apparatus disclosed herein are not limited by the following embodiments.

In a technology in which a sacrificial film is embedded into a hole, and the sacrificial film is removed after the hard mask is removed, a process of embedding the sacrificial film into the hole and a process of removing the sacrificial film after the hard mask is removed become necessary. The process of embedding the sacrificial film and the process of removing the sacrificial film are often performed by different apparatuses. For this reason, a work that transfers a substrate between the apparatuses is necessary, making it difficult to improve a throughput of the substrate processing.

Therefore, an aspect of the present disclosure provides a technology capable of reducing an amount of work included in a step of removing the hard mask.

<Etching Method>

Figure 1:
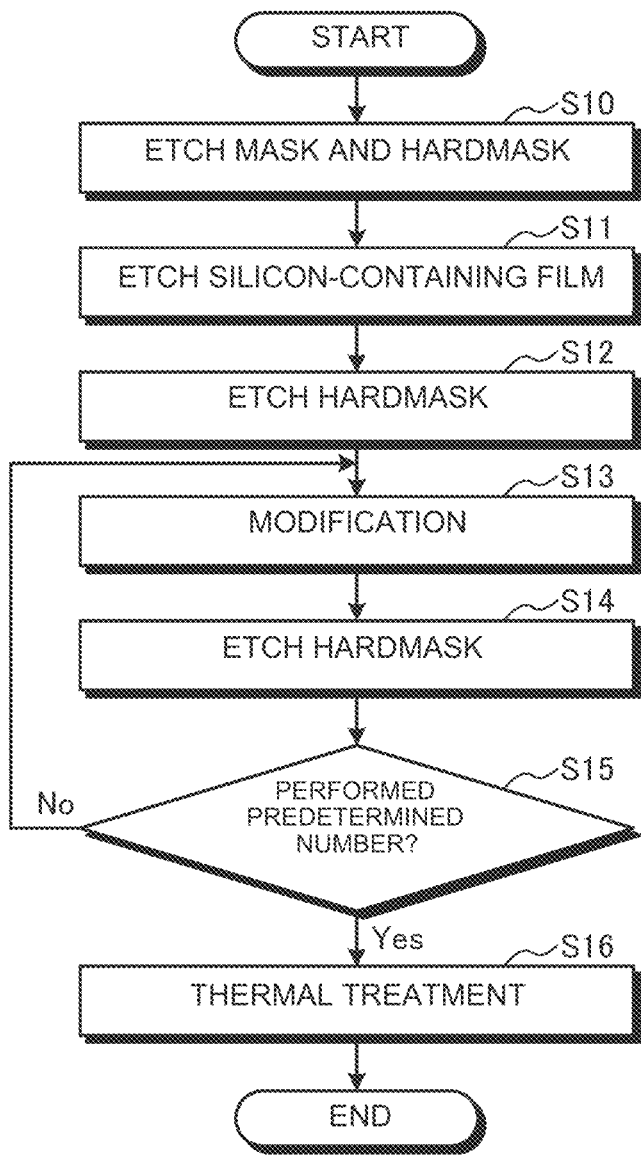
FIG. 1 is a flowchart illustrating an example of an etching method according to an embodiment of the present disclosure.
Figure 2:
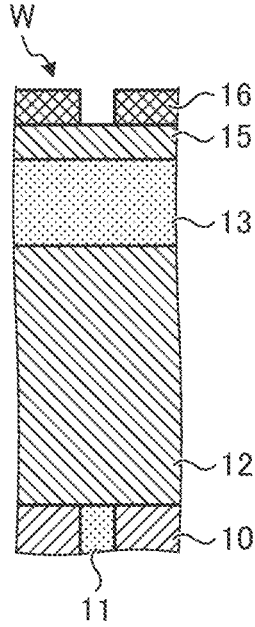
FIG. 2 is a sectional view illustrating an example of a substrate of a processing target.

FIG. 1 is a flowchart illustrating an example of an etching method according to an embodiment of the present disclosure. In the etching method illustrated in FIG. 1, for example, a substrate W illustrated in FIG. 2 is etched. FIG. 2 is a sectional view illustrating an example of the substrate W of a processing target. The process steps in FIG. 1 are described below along with FIGS. 2-6, which show the substrate W is various intermediary states of processing.

As shown in FIG. 2, for example, the substrate W of the processing target includes a silicon-containing film 12, a hard mask 13, a mask 15, and a resist 16 stacked in this order on a base 10 of silicon or the like having an embedded metal wiring 11. The mask 15 may be, for example, a silicon-containing mask, a carbon-containing mask, or a stacked film thereof.

In the present embodiment, the metal wiring 11 includes, for example, tungsten. The metal wiring 11 is an example of a first film.

The silicon-containing film 12 includes, for example, at least one of a silicon nitride film (SiN), a carbon-containing silicon nitride film (SiCN), and a silicon oxide film ($SiO_2$). The silicon-containing film 12 is an example of a second film.

The hard mask 13 is a metal compound containing the same type of metal as the metal included in the metal wiring 11. In the present embodiment, the hard mask 13 contains, for example, tungsten. The hard mask 13 is, for example, tungsten silicide (WSi).

A predetermined pattern is formed on the resist 16.

With reference to FIG. 1, first, the mask 15 and the hard mask 13 are etched (S10). In step S10, for example, the mask 15 is etched along a pattern formed on the resist 16 using the resist 16 as a mask, and the pattern of the resist 16 is transferred to the mask 15. Then, the hard mask 13 is etched along the pattern formed on the mask 15 using the mask 15 as a mask, and the pattern of the mask 15 is transferred to the hard mask 13. Then, the resist 16 and the mask 15 are removed. The silicon-containing film 12 of a lower layer of the hard mask 13 may be etched while the resist 16 and the mask 15 are left.

Figure 3:
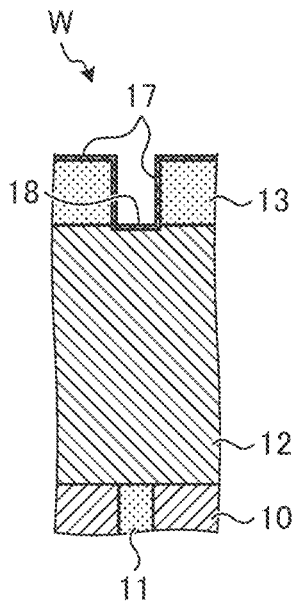
FIG. 3 is a sectional view illustrating an example of the substrate after a hard mask is etched.

As a result, the substrate W enters, for example, a state as shown in FIG. 3. FIG. 3 is a sectional view illustrating an example of the substrate W after the hard mask 13 is etched. After the etching of the hard mask 13 is performed, for example, as illustrated in FIG. 3, a hole or a trench having a predetermined pattern by the hard mask 13 is formed. Then, a part of the silicon-containing film 12 is exposed into the hole or the trench formed in the hard mask 13. A surface layer 17 is formed on a sidewall of the hole or the trench of the hard mask 13 due to reaction by-products and the like during the etching of the hard mask 13. Further, a surface layer 18 is also formed on the surface of the silicon-containing film 12 that is exposed into the hole or the trench of the hard mask 13 due to the reaction by-products and the like during the etching of the hard mask 13.

Figure 4:
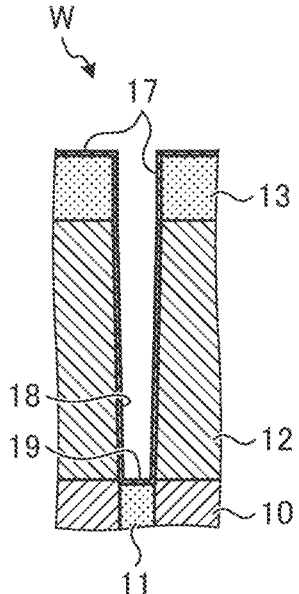
FIG. 4 is a sectional view illustrating an example of the substrate after a silicon-containing film is etched.

Next, the silicon-containing film 12 is etched along the pattern formed on the hard mask 13 using the hard mask 13 as a mask, and the pattern of the hard mask 13 is transferred to the silicon-containing film 12 (S11). As a result, for example, the substrate W in a state as shown in FIG. 4 is prepared. S11 is an example of the preparing step.

FIG. 4 is a sectional view illustrating an example of the substrate W after the silicon-containing film 12 is etched. After the etching of the silicon-containing film 12 is performed, for example, as illustrated in FIG. 4, the hole or the trench having a predetermined pattern is formed in the silicon-containing film 12. Then, a part of the metal wiring 11 of the lower layer of the silicon-containing film 12 is exposed into the hole or the trench formed in the silicon-containing film 12. A surface layer 19 is formed on the surface of the metal wiring 11 that is exposed into the hole or the trench of the silicon-containing film 12 due to reaction by-products and the like during the etching of the surface layer 18.

Subsequently, the hard mask 13 of the substrate W is etched (S12). Step S12 is executed for a time longer than a first time T1 and shorter than a second time T2. The first time T1 is the time from a start of a supply of an etching gas to a start of the etching of the hard mask 13. The second time T2 is the time from the start of the supply of the etching gas to the start of an etching of the metal wiring 11 that is exposed to a bottom of the hole or the trench of the silicon-containing film 12.

In step S12, the etching of the hard mask 13 is performed using the fluorine-containing gas. In the present embodiment, the etching of the hard mask 13 is performed using a mixed gas of the fluorine-containing gas and a dilution gas. In the present embodiment, the fluorine-containing gas is, for example, a $ClF_3$ gas, and the dilution gas is, for example, an argon gas. The fluorine-containing gas may be a gas containing at least one of a $ClF_3$ gas, an $F_2$ gas, an $SF_6$ gas, and an $IF_7$ gas.

The main conditions in step S12 are as follows, for example.

Figure 5:
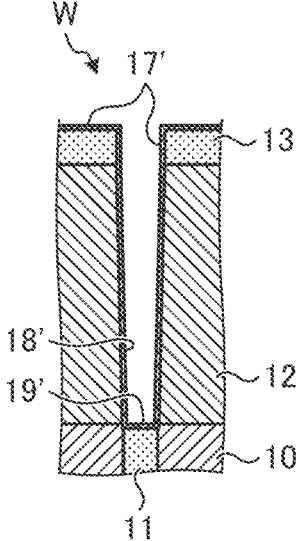
FIG. 5 is a sectional view illustrating an example of the substrate after a modification process is performed.

Temperature of the substrate W: 20 to 120° C.
$ClF_3$ gas: 100 to 230 sccm
Argon gas: 100 to 200 sccm
Pressure: 0.5 to 3 Torr
Processing time: 5 to 60 seconds Next, the surface of the substrate W is modified by supplying a modification gas to the surface of the substrate W (S13). The process in step S13 is an example of a modification step. In the present embodiment, the modification gas is, for example, argon gas. The modification gas may be another rare gas, a nitrogen gas, an oxygen gas, steam, a hydrogen gas, or a carbon monoxide gas. As a result, the substrate W enters, for example, a state as shown in FIG. 5. FIG. 5 is a sectional view illustrating an example of the substrate W after a modification process is performed. By performing the modification process, a surface layer 17' is formed on the surface of the hard mask 13, a surface layer 18' is formed on the surface of the silicon-containing film 12, and a surface layer 19' is formed on the surface of the metal wiring 11.

The main conditions in step S13 are as follows, for example.

Temperature of the substrate W: 20 to 120° C.
Argon gas: 200 to 400 sccm
Pressure: 0.5 to 3 Torr
Processing time: 30 to 120 seconds Subsequently, the hard mask 13 of the substrate W is etched again (S14). The process in step S14 is similar to the process in step S12. The process in steps S12 and S14 is an example of the removing step.

Subsequently, it is determined whether the process of steps S13 and S14 has been executed a predetermined number of times (S15). In a case where the process of steps S13 and S14 has not been executed a predetermined number of times (S15: No), the process illustrated in step S13 is executed again.

Figure 6:
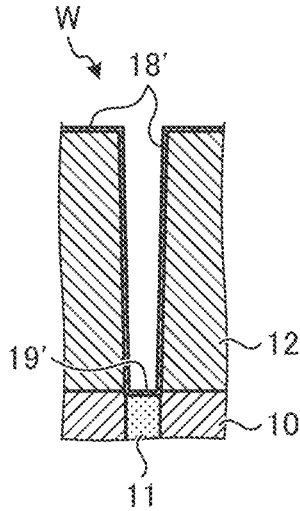
FIG. 6 is a sectional view illustrating an example of the substrate after the hard mask is removed.

Meanwhile, in a case where the process of steps S13 and S14 has been executed a predetermined number of times (S15: Yes), the substrate W enters, for example, a state illustrated in FIG. 6. FIG. 6 is a sectional view illustrating an example of the substrate W after the hard mask 13 is removed. In a case where the process of steps S13 and S14 is executed a predetermined number of times, for example, as illustrated in FIG. 6, the hard mask 13 of the substrate W is removed. As described above, in the etching method of the present embodiment, the process of step S13 and the process of step S14 are repeated one or more times in this order.

Subsequently, the substrate W is subjected to a thermal treatment (S16). In step S16, particles of the corrosive gas that adhere to the surface of the substrate W by etching may be removed. Then, the etching method illustrated in FIG. 1 is completed.

[Etching Start Waiting Time]

Figure 7:
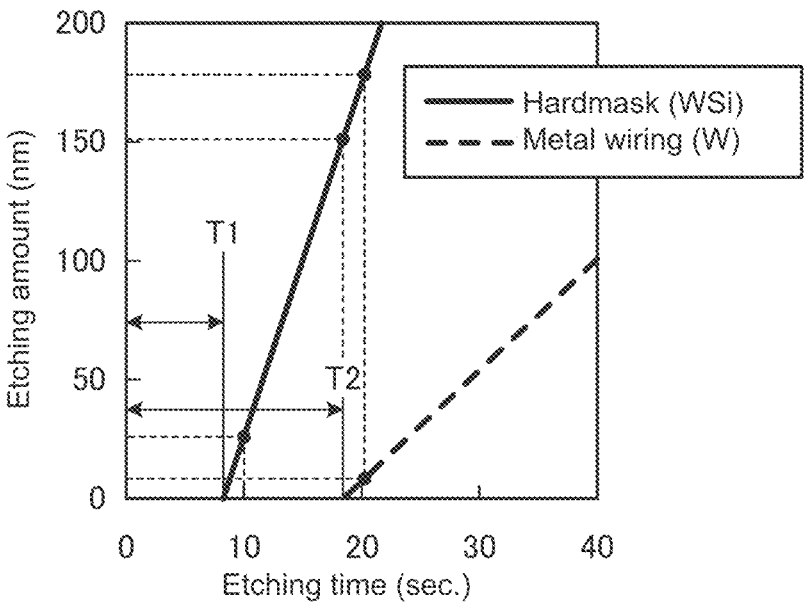
FIG. 7 is a diagram illustrating an example of test results in an etching start waiting time of the hard mask and metal wiring.

FIG. 7 is a diagram illustrating an example of test results in the etching start waiting time of the hard mask 13 and the metal wiring 11. FIG. 7 illustrates etching amounts of the hard mask 13 and the metal wiring 11 with the time when the supply of the etching gas is started as a reference. In the present embodiment, the hard mask 13 is, for example, tungsten silicide (WSi), and the metal wiring 11 is, for example, tungsten (W). Further, in the present embodiment, the etching gas is a mixed gas of a $ClF_3$ gas and an argon gas, and the modification gas is an argon gas.

In the hard mask 13, for example, as shown in FIG. 7, the etching starts after the first time T1 elapses from the start of the supply of the etching gas. In the present embodiment, the first time T1 is, for example, about 8 seconds. Then, after about 20 seconds from the start of the supply of the etching gas, the etching amount of the hard mask 13 reaches 170 nm or more.

Meanwhile, in the metal wiring 11, for example, as illustrated in FIG. 7, the etching starts after the second time T2 elapses from the start of the supply of the etching gas. In the present embodiment, the second time T2 is, for example, about 18 seconds. Then, after about 20 seconds from the start of the supply of the etching gas, the etching amount of the hard mask 13 is about 10 nm.

The first time T1 is considered to be the time required for the surface layer 17 formed on the surface of the hard mask 13 to be etched. Further, the second time T2 is considered to be the time required for the surface layer 19 formed on the surface of the metal wiring 11 to be etched. Hereinafter, the first time T1 and the second time T2 may be referred to as the etching start waiting time.

Here, in a case where the etching of the substrate in which the hard mask 13 and the metal wiring 11 are exposed is executed for a time longer than the first time T1 and shorter than the second time T2, only the hard mask 13 of the hard mask 13 and the metal wiring 11 can be etched.

However, referring to the results of FIG. 7, in order to etch only the hard mask 13 by the etching executed for the time longer than the first time T1 and shorter than the second time T2, the hard mask 13 can be etched only up to about 150 nm. When an aspect ratio of the hole or trench formed in the silicon-containing film 12 increases, it is necessary to increase the film thickness of the hard mask 13. For this reason, the hard mask 13 having a film thickness of 150 nm or more may remain on the silicon-containing film 12 at the point in time when the etching of the silicon-containing film 12 is completed. In this case, it is difficult to completely remove the remaining hard mask 13 by an etching for a time longer than the first time T1 and shorter than the second time T2.

Therefore, it is conceivable to completely remove the hard mask 13 by executing an etching for a time longer than the first time T1 and shorter than the second time T2 two or more times. However, even when the etching for the time longer than the first time T1 and shorter than the second time T2 is just executed two or more times, the surface layer 17 of the hard mask 13 and the surface layer 19 of the metal wiring 11 are not formed in the second or subsequent etching. For this reason, it is considered that in the second or subsequent etching, the etchings for both the hard mask 13 and the metal wiring 11 are immediately started. As a result, it is difficult to remove the hard mask 13 while suppressing the etching amount of the metal wiring 11.

Therefore, in the present embodiment, after the etching for the time longer than the first time T1 and shorter than the second time T2 is performed, the surfaces of the hard mask 13 and the metal wiring 11 are intended to be modified. As a result, the surface layer 17' is again formed on the surface of the hard mask 13, and the surface layer 19' is again formed on the surface of the metal wiring 11. Thus, the etching start waiting time of the hard mask 13 and the metal wiring 11 is restored.

Here, after an etching for 10 seconds is performed, the modification is performed, and in a case where the etching for 10 seconds is performed again, the measurement results in the etching amounts of the hard mask 13 and the metal wiring 11 are given, for example, as shown in Table 1 below. The measurement results in the etching amounts of SiN, SiCN, and $SiO_2$ that may be included in the silicon-containing film 12 are also shown in Table 1 below. In Table 1, since the etching amount of less than 1 nm cannot be measured, it is denoted by N.A.

TABLE 1

|  | Etching Amount |
| --- | --- |
| WSi | 32 [nm] |
| W | N.A. |
| SiCN | N.A. |
| SiN | N.A. |
| $SiO_2$ | N.A. |

In a case where the etching for 10 seconds is performed twice, it is conceivable that the etching amount is the same as that of a case where the etching is continuously performed for 20 seconds unless the modification process is performed. In a case where the etching is continuously performed for 20 seconds, it is conceivable that the etching amount of the metal wiring 11 becomes, for example, about 10 nm as shown in FIG. 7. However, referring to the results in Table 1, since the etching amount of the metal wiring 11 that is tungsten is less than 1 nm (N.A.), it is considered that the surface layer 19' is formed on the surface of the metal wiring 11 by the modification process.

Further, in a case where the etching is continuously performed for 20 seconds, it is conceivable that the etching amount of the hard mask 13 is, for example, 170 nm or more as illustrated in FIG. 7. However, referring to the results in Table 1, the etching amount of the hard mask 13 that is tungsten silicide is 32 nm. This is considered because the surface layer 17' is formed on the surface of the hard mask 13 by the modification process, and the etching start waiting time of the same degree as the first time T1 generates again. Further, it is considered that the surface layer 18' is also formed on the surface of the silicon-containing film 12 by the modification process.

Referring to FIG. 7, in a case where the etching is performed for 10 seconds, the etching amount of the hard mask 13 is about 20 nm. Here, assuming that etching ease for the surface layer 17' formed by the modification process is substantially the same as that of the surface layer 17, it is considered that the etching amount of the hard mask 13 becomes about 40 nm by two times of the etching. However, in the test results in Table 1, the etching amount of the hard mask 13 was 32 nm. This is considered because the surface layer 17' formed by the modification process is a film that is more difficult to etch than the surface layer 17.

Here, in a case where the sacrificial film is embedded into the hole or the trench formed in the silicon-containing film 12 and the sacrificial film is removed after the hard mask 13 is removed, a plurality of apparatuses for performing these processes are required. For example, an apparatus for performing a process of embedding the sacrificial film into the hole or the trench and an apparatus for performing a process of removing the sacrificial film after the hard mask 13 is removed are required. As a result, a space for disposition of these apparatuses is required, and a footprint of the entire system becomes large. Further, since a work of transferring the substrate W between these apparatuses becomes necessary, it is difficult to improve the process throughput.

In contrast, in the present embodiment, since it is not necessary to embed the sacrificial film into the hole or the trench formed in the silicon-containing film 12, it is not necessary to provide an apparatus for embedding or removing the sacrificial film. Therefore, the footprint of the entire system can be reduced. Further, since the work of transferring the substrate W between the apparatuses for embedding or removing the sacrificial film becomes unnecessary, the throughput of the process can be improved.

[Configuration of Etching System]

Figure 8:
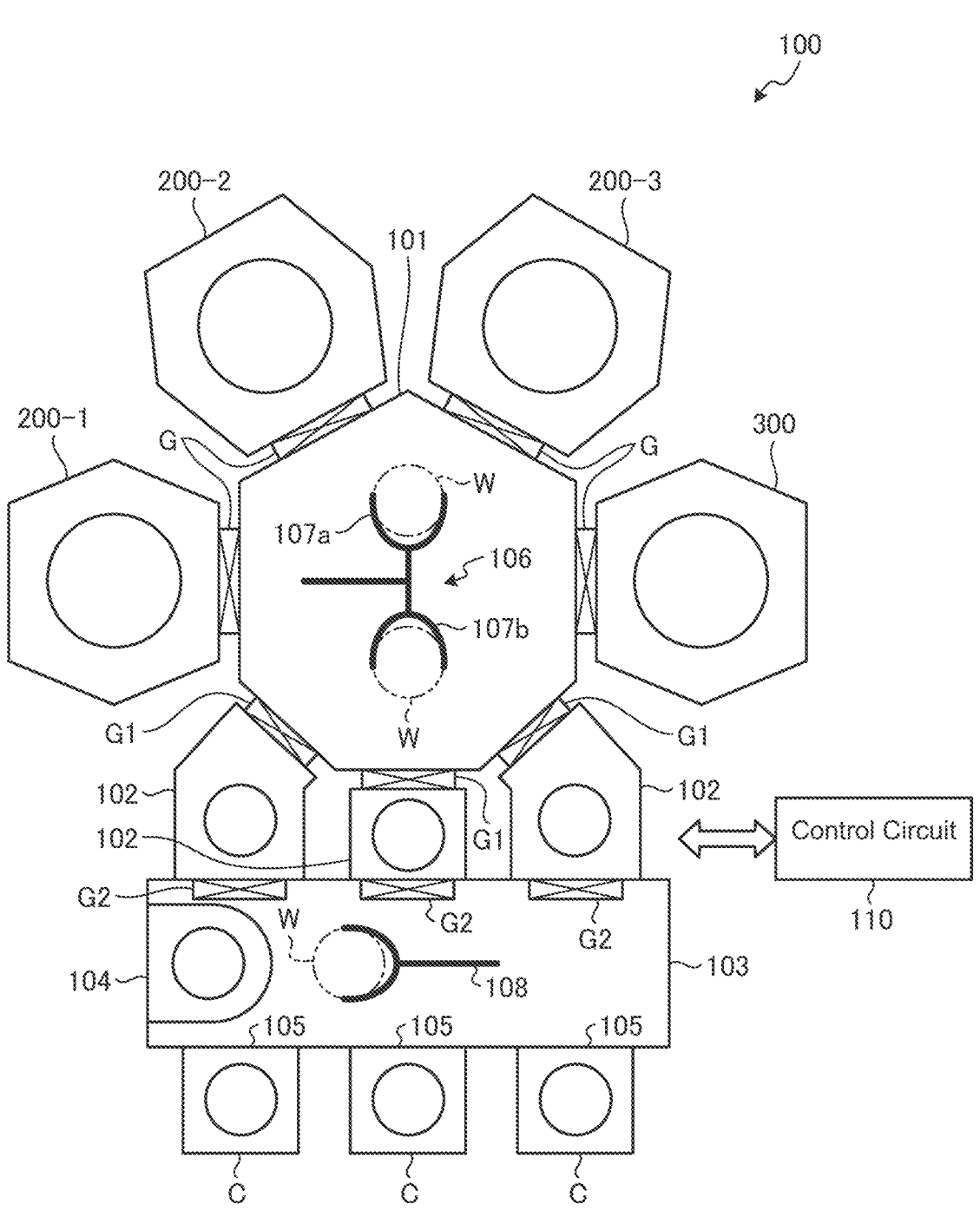
FIG. 8 is a schematic diagram illustrating an example of an etching system.

FIG. 8 is a schematic diagram illustrating an example of an etching system 100 that performs the processes of steps S12 to S16. The etching system 100 in the present embodiment includes an etching apparatus 200-1, an etching apparatus 200-2, an etching apparatus 200-3, and a thermal treatment apparatus 300. The etching system 100 is a multi-chamber type vacuum processing system. The etching apparatus 200-1, the etching apparatus 200-2, and the etching apparatus 200-3 have the same configurations. Hereinafter, the etching apparatus 200 will be referred to collectively without distinguishing the etching apparatus 200-1, the etching apparatus 200-2, and the etching apparatus 200-3 from each other.

Each etching apparatus 200 repeats the etching and modification process with respect to the substrate W to remove the hard mask 13. The thermal treatment apparatus 300 heats the substrate W from which the hard mask 13 has been removed by the etching apparatus 200, thereby removing the corrosive gas that has adhered to the surface of the substrate W by the process of the etching apparatus 200.

The etching apparatus 200-1, the etching apparatus 200-2, the etching apparatus 200-3, and the thermal treatment apparatus 300 are connected to four sidewalls of a vacuum transfer chamber 101 having a heptagonal plan shape via gate valves G, respectively. Three load-lock chambers 102 are connected to the other three sidewalls of the vacuum transfer chamber 101 via gate valves G1. Each of the three load-lock chambers 102 is connected to an atmospheric transfer chamber 103 via gate valves G2.

The inside of the vacuum transfer chamber 101 is evacuated by a vacuum pump to maintain a predetermined vacuum level. A transfer mechanism 106 such as a robot arm is provided inside the vacuum transfer chamber 101. The transfer mechanism 106 transfers the substrate W between the respective etching apparatuses 200, the thermal treatment apparatus 300, and the respective load-lock chambers 102. The transfer mechanism 106 has two arms 107a and 107b that can be moved independently.

A plurality of ports 105 for attaching carriers C such as a front-opening unified pod (FOUP) for accommodating the substrate W are provided on a side surface of the atmospheric transfer chamber 103. Further, an alignment chamber 104 for performing alignment of the substrate W is provided in the sidewall of the atmospheric transfer chamber 103. Further, a down flow of clean air is formed inside the atmospheric transfer chamber 103.

A transfer mechanism 108 such as a robot arm is provided inside the atmospheric transfer chamber 103. The transfer mechanism 108 transfers the substrate W between the respective carriers C, the respective load-lock chambers 102, and the alignment chamber 104.

A control circuit 110 includes a memory, a processor (e.g., circuitry that is configured by execution of computer readable instructions), and an input/output interface. The memory stores, for example, programs to be executed by the processor, and recipes that include conditions for each process. The processor executes the program(s) read from the memory, and controls each part of the etching system 100 via the input/output interface based on the recipes stored in the memory.

The substrate W in which the silicon-containing film 12 is etched in step S11 is accommodated into the carrier C and set in the port 105. The transfer mechanism 108 in the atmospheric transfer chamber 103 takes out the substrate W from the carrier C, and places the substrate W in the alignment chamber 104 to adjust the orientation of the substrate W. Then, the transfer mechanism 108 takes out the substrate W from the alignment chamber 104 and carries in the substrate W in any one of the load-lock chambers 102. The transfer mechanism 106 in the vacuum transfer chamber 101 takes out the substrate W from the load-lock chamber 102 and carries in the substrate W into any one of the etching apparatuses 200. The etching apparatus 200 in which the substrate W is carried in removes the hard mask 13 from the substrate W by etching the hard mask 13 of the substrate W.

The substrate W from which the hard mask 13 has been removed is carried in into the thermal treatment apparatus 300 by the transfer mechanism 106. The thermal treatment apparatus 300 heats the substrate W to remove the particles of the corrosive gas that adhere to the surface of the substrate W by etching.

[Configuration of Etching Apparatus]

Figure 9:
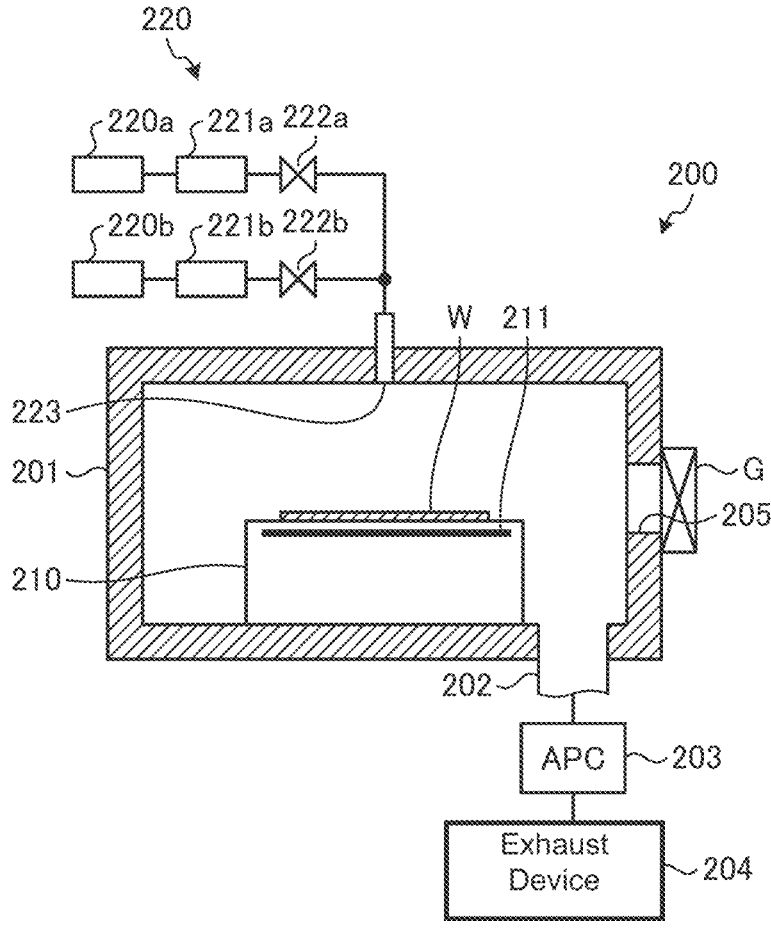
FIG. 9 is a schematic sectional view illustrating an example of an etching apparatus.

FIG. 9 is a schematic sectional view illustrating an example of the etching apparatus 200. The etching apparatus 200 has a chamber 201. A stage 210 on which the substrate W is placed is provided inside the chamber 201. A heater 211 for controlling a temperature of the substrate W placed on the stage 210 is provided inside the stage 210. The temperature of the heater 211 is controlled by the control circuit 110.

An automatic pressure control (APC) valve 203 and an exhaust device 204 are connected to a bottom of the chamber 201 via an exhaust pipe 202. The exhaust device 204 exhausts the gas inside the chamber 201. The APC valve 203 controls a pressure inside the chamber 201 to a predetermined pressure. The APC valve 203 and the exhaust device 204 are controlled by the control circuit 110.

An opening 205 communicating with the vacuum transfer chamber 101 is formed in a sidewall of the chamber 201. The opening 205 is opened and closed by a gate valve G.

A gas supply pipe 223 for supplying a gas into the chamber 201 is provided in an upper portion of the chamber 201. A gas supply 220 is connected to the gas supply pipe 223. The gas supply 220 includes a gas supply source 220a, a gas supply source 220b, a flow rate controller 221a, a flow rate controller 221b, a valve 222a, and a valve 222b. The gas supply 220 is controlled by the control circuit 110.

The gas supply pipe 223 is connected to the gas supply source 220a via the valve 222a and the flow rate controller 221a. Further, the gas supply source 220b is connected to the gas supply pipe 223 via the valve 222b and the flow rate controller 221b.

The gas supply source 220a is a supply source of a fluorine-containing gas. In the present embodiment, the fluorine-containing gas is, for example, the $ClF_3$ gas. The gas supply source 220b is a supply source of a dilution gas.

In an embodiment, the dilution gas is also used as a modification gas. In the present embodiment, the rare gas is, for example, an argon gas.

The flow rate controller 221a controls the flow rate of the gas supplied from the gas supply source 220a, and supplies the gas whose flow rate is controlled into the chamber 201 via the valve 222a and the gas supply pipe 223. The flow rate controller 221b controls the flow rate of the gas supplied from the gas supply source 220b, and supplies the gas whose flow rate is controlled into the chamber 201 via the valve 222b and the gas supply pipe 223.

The embodiment has been described above. As described above, the etching method in the present embodiment includes the preparing step and the removing step. In the preparing step, the substrate W is prepared which includes the metal wiring 11, the silicon-containing film 12 stacked on the metal wiring 11, and the hard mask 13 stacked on the silicon-containing film 12, such that the silicon-containing film 12 is etched with the hard mask 13 having a formed pattern as a mask until the metal wiring 11 is exposed. In the removing step, the hard mask 13 is removed using the fluorine-containing gas. Further, the removing step is executed for a time longer than the first time T1 from the start of the supply of the fluorine-containing gas to the start of the etching of the hard mask 13, and shorter than the second time T2 from the start of the supply of the fluorine-containing gas to the start of the etching of the metal wiring 11. As a result, it is possible to reduce a work included in the step of removing the hard mask 13.

Further, the etching method in the embodiment described above further includes a modification step of modifying the surface of the metal wiring 11 and the surface of the hard mask 13 by supplying the modification gas to the substrate W after the removing step. Further, after the modification step, the removing step is further executed. It is possible to reduce the work included in the step of removing the hard mask 13.

Further, in the embodiment described above, the modification step and the removing step are repeated one or more times in this order. As a result, the hard mask 13 can be removed while the damage to the metal wiring 11 is suppressed.

Further, in the embodiment described above, the modification gas is a rare gas, a nitrogen gas, an oxygen gas, steam, a hydrogen gas, or a carbon monoxide gas. As a result, after the etching of the hard mask 13, the surface layer 17' can be formed on the surface of the hard mask 13, and the surface layer 19' can be formed on the surface of the metal wiring 11. As a result, the hard mask 13 can be removed while the damage to the metal wiring 11 is suppressed.

Further, in the embodiment described above, the hard mask 13 contains the same type of metal as the metal included in the metal wiring 11. In the present embodiment, the metal wiring 11 and the hard mask 13 contain tungsten. Also in the hard mask 13 and the metal wiring 11 having such a configuration, the hard mask 13 can be removed while the damage to the metal wiring 11 is suppressed.

Further, in the embodiment described above, the fluorine-containing gas includes at least one of a $ClF_3$ gas, an $F_2$ gas, an $SF_6$ gas, and an $IF_7$ gas. Accordingly, the hard mask 13 can be removed.

Further, in the embodiment described above, the silicon-containing film 12 is a silicon nitride film, a carbon-containing silicon nitride film, or a silicon oxide film. As a result, the hard mask 13 can be removed while the damage to the metal wiring 11 and the silicon-containing film 12 is suppressed.

Further, the etching apparatus 200 in the embodiment described above includes the chamber 201, the gas supply 220, and the control circuit 110. The chamber 201 accommodates the substrate W having the metal wiring 11, the silicon-containing film 12 stacked on the metal wiring 11, and the hard mask 13 stacked on the silicon-containing film 12. With respect to the hard mask 13, the substrate W is accommodated therein such that the silicon-containing film 12 is etched with the hard mask 13 having a formed pattern as a mask until the metal wiring 11 is exposed. The gas supply 220 supplies a fluorine-containing gas into the chamber 201. The control circuit 110 executes the removing step of removing the hard mask 13 by controlling the gas supply 220 to supply the fluorine-containing gas into the chamber 201 in which the substrate W is accommodated. The removing step is executed for a time longer than the first time T1 from the start of the supply of the fluorine-containing gas to the start of the etching of the hard mask 13, and shorter than the second time T2 from the start of the supply of the fluorine-containing gas to the start of the etching of the metal wiring 11. As a result, it is possible to reduce a work included in the step of removing the hard mask 13.

(Other)

The technology disclosed in the present application is not limited to the above-described embodiment, and various modifications are possible within the scope of the gist thereof.

For example, in the embodiment described above, after the process of the etching of the hard mask 13 in step S12, the processes in steps S13 and S14 are executed at least once. However, the technology disclosed herein is not limited thereto. For example, the processes in steps S13 to S15 may not be executed as long as the hard mask 13 can be removed through the process in step S12.

It should be considered that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

The invention claimed is:

1. An etching method comprising:
preparing a substrate which includes a first film, a second film stacked on the first film, and a hard mask stacked on the second film, the hard mask having a pattern that exposes an exposed portion of the second film to etching such that the etching of the exposed portion of the second film continues until the first film is exposed;
removing the hard mask using a fluorine-containing gas, and
modifying surfaces of the first film and the hard mask by supplying a modification gas to the substrate after the removing,
wherein the removing is executed for a time longer than a first time that occurs from a start of a supply of the fluorine-containing gas to a start of an etching of the hard mask, and shorter than a second time from the start of the supply of the fluorine-containing gas to a start of an etching of the first film, and wherein the removing is further executed after the modifying.

2. The etching method according to claim 1, wherein the modifying and the removing are collectively repeated in order one or more times.

3. The etching method according to claim 2, wherein the hard mask is a metal compound containing a same type of metal as a metal included in the first film.

4. The etching method according to claim 2, wherein the fluorine-containing gas includes at least any one of a CIF3 gas, an F2 gas, an SF6 gas, and an IF7 gas.

5. The etching method according to claim 2, wherein the second film is a silicon nitride film, a carbon-containing silicon nitride film, or a silicon oxide film.

6. The etching method according to claim 2, wherein the modification gas is a rare gas, a nitrogen gas, an oxygen gas, steam, a hydrogen gas, or a carbon monoxide gas.

7. The etching method according to claim 6, wherein the hard mask is a metal compound containing a same type of metal as a metal included in the first film.

8. The etching method according to claim 1, wherein the modification gas is a rare gas, a nitrogen gas, an oxygen gas, steam, a hydrogen gas, or a carbon monoxide gas.

9. The etching method according to claim 8, wherein the hard mask is a metal compound containing a same type of metal as a metal included in the first film.

10. The etching method according to claim 8, wherein the fluorine-containing gas includes at least any one of a CIF3 gas, an F2 gas, an SF6 gas, and an IF7 gas.

11. The etching method according to claim 8, wherein the second film is a silicon nitride film, a carbon-containing silicon nitride film, or a silicon oxide film.

12. The etching method according to claim 1, wherein the hard mask is a metal compound containing a same type of metal as a metal included in the first film.

13. The etching method according to claim 12, wherein the metal is tungsten.

14. The etching method according to claim 1, wherein the fluorine-containing gas includes at least any one of a CIF3 gas, an F2 gas, an SF6 gas, and an IF7 gas.

15. The etching method according to claim 1, wherein the second film is a silicon nitride film, a carbon-containing silicon nitride film, or a silicon oxide film.

* * * * *